United States Patent [19]

Szepesi

[11] Patent Number: 4,920,309
[45] Date of Patent: Apr. 24, 1990

[54] ERROR AMPLIFIER FOR USE WITH PARALLEL OPERATED AUTONOMOUS CURRENT OR VOLTAGE REGULATORS USING TRANSCONDUCTANCE TYPE POWER AMPLIFIERS

[75] Inventor: Tamas S. Szepesi, San Jose, Calif.

[73] Assignee: National Semiconductor Corporation, Santa Clara, Calif.

[21] Appl. No.: 328,166

[22] Filed: Mar. 24, 1989

[51] Int. Cl.⁵ .................. G05F 1/46; H02M 3/158
[52] U.S. Cl. ............................ 323/269; 323/272; 323/280; 323/281; 363/65; 307/58; 307/82
[58] Field of Search ............. 323/268, 269, 271, 272, 323/273, 274, 280, 281; 363/65, 69, 70, 71; 307/52, 53, 58, 60, 82

[56] References Cited

U.S. PATENT DOCUMENTS

| | | | |
|---|---|---|---|
| 3,890,559 | 6/1975 | Kuster | 323/280 |
| 4,074,182 | 2/1978 | Weischedel | 323/269 |
| 4,194,147 | 3/1980 | Payne et al. | 323/272 |
| 4,270,165 | 5/1981 | Carpenter et al. | 307/82 |
| 4,535,282 | 8/1985 | Nguyen | 323/269 |
| 4,635,178 | 1/1987 | Greenhalgh | 307/82 |
| 4,766,364 | 8/1988 | Biamonte et al. | 323/272 |

FOREIGN PATENT DOCUMENTS 0089116 6/1982 Japan .................. 323/280

Primary Examiner—Peter S. Wong
Attorney, Agent, or Firm—Limbach, Limbach & Sutton

[57] ABSTRACT

An error amplifier is disclosed for use in linear or switched-mode voltage or current regulators that use a transconductance type power-amplifier, enabling easy modular parallel connection of said regulators by simply parallel wiring of normally externally accessible nodes of the individual regulators: power-input, power-output, error amplifier output, and error amplifier input, to boost the system's total output power by about equally sharing the total output power among the individual regulators, including a. an amplifier with grossly asymmetric output current capability in sink and source directions; and
b. a sense circuit to slightly modify the voltage on the reference input of the said amplifier when the lower value output current limit becomes active so that it causes positive feedback thereby ensuring that at any time only one of the plurality of parallel operated amplifiers is active and controls the system's output while all the other amplifiers are in current limit and thereby inactive.

11 Claims, 5 Drawing Sheets

ERROR AMPLIFIER FOR USE WITH PARALLEL OPERATED AUTONOMOUS CURRENT OR VOLTAGE REGULATORS USING TRANSCONDUCTANCE TYPE POWER AMPLIFIERS

FIELD OF THE INVENTION

This invention relates to the field of error amplifiers for use with autonomous parallel operated voltage or current regulators with transconductance type power amplifiers; e.g., current-mode controlled DC/DC converters. More particularly, this invention relates to error amplifiers with asymmetrical output current capabilities ganged together to enable fully redundant, autonomous control of parallel operated systems for modularly increased current capability and for higher reliability.

BACKGROUND OF THE INVENTION

A common practice among designers of current-mode controlled DC to DC voltage converters is to design a modular system with parallel operated power cells. Then, in order to develop a system for specific applications, the designer need only gang together an appropriate number of these cells to achieve the desired power level.

FIG. 1 shows a converter cell having a transconductance type power amplifier used as a voltage regulator. The supply voltage $V_S$ is connected to input node 1 providing power for the transconductance amplifier 2. The error amplifier 3 compares the reference voltage $V_{ref}$ 4 with a fraction $V_{frac}$ 9 of output voltage $V_{out}$ 10 and controls the voltage on control terminal 8 of the transconductance amplifier 2 so that the output current 11 generates the required output voltage $V_{out}$ 10 on the resistor load 7. Typically, $V_{ref}$ is approximately equal to $V_{frac}$. The fraction $V_{frac}$ 9 of the output voltage $V_{out}$ 10 is typically generated by a voltage divider network formed across a pair of resistors $R_1$ and $R_2$ coupled between the output of the transconductance amplifier 2 and ground.

FIG. 2 shows the prior art of parallel connection of multiple transconductance cells which is used to increase the system's output current capability. The system of FIG. 2 comprises three converter cells 30a, 30b and 30c; of course more or less such cells may be used as appropriate. Each of cells 30a, 30b and 30c is comprised of a transconductance type power-amplifier (DC converter) 32, an error amplifier 34 and a reference supply $V_{ref}$ 36. Each identifying number for the elements of each cell is shown with an a, b or c subscript as appropriate. Where a cell element is referred to without an alphabetic modifier it is understood that all similar elements in each cell is being described.

A supply voltage to be converted is applied to the DC input terminal 38 which is electrically coupled to the input 40 of each DC converter 32. The DC converter outputs 42 are electrically coupled together at the node 44. The node 44 is also coupled to voltage divider resistor 46, load 50 and the output node 52. Voltage divider resistor 46 is also coupled to the node 48. The node 48 is coupled to the voltage divider resistor 54. The voltage divider resistor 54 and the load 50 are each coupled to ground.

The node 48 is coupled to the error amplifier input 56a. The voltage at the error amplifier input 56a is compared to the reference $V_{ref}$ 36a to determine whether an error has occurred. Any error in the DC voltage on node 44 is amplified by the error amplifier 34a and applied to error amplifier output 58a. The voltage on the error amplifier output 58a is applied to each input 64 of each transconductance type power amplifier 32. The signal applied to the control input 64 drives the output currents $I_{out}$ 43 of the transconductance type power amplifiers 32 to produce the required output voltage on the load 50 so that the sense voltage 56a is always approximately equal with reference voltage 62a. The sum of the output currents 43 of the individual cells gives the output current 45 of the system. If the transconductance of the transconductance amplifier 32 in each cell 30 is nearly equal to each other then the cells will approximately equally share the output current 45 because the control voltage 64 is common for each cell. If the output current of each cell is limited to $I_{max}$, by the allowed power dissipation, the total output current of a system of n cells is $n * I_{max}$. In this case n=3 for the three cells. One disadvantage of this system is that it uses only one of the error amplifiers. The cell with the active error amplifier, 34a, controls the whole system and is normally called the master. If the master error amplifier 34a fails, the whole system will fail, i.e., the system is not fully redundant. The other disadvantage of this solution is that two control connection points (or pins in case of integrated solutions) per cell are needed to achieve the parallel operation (64, 58).

It is an object of the present invention to provide an error amplifier circuit for use in high reliability fully redundant masterless modular applications.

It is another object of the present invention to provide this feature with only one control access per module.

These and other features will be achieved and described with respect to a preferred embodiment below.

SUMMARY OF THE INVENTION

The invention disclosed in this patent is an error amplifier system for use with multiple parallel operated voltage or current regulators with transconductance type power amplifiers. The error amplifiers may be used for example with linear voltage regulators or dc to dc converters. The system includes a plurality of error amplifiers. Each of the error amplifiers has an output means, a means for electrically coupling each of the output means to every other such output means and a means for establishing an asymmetrical current capability for each of the output means. The asymmetrical current capability has a current supplying or source current capability greater than a current consuming or sink current capability. Furthermore, each amplifier has an internal sense circuitry to sense when the amplifier is operating in saturation on the sink side, outside of its linear range and changes the voltage on its reference input by a small amount so that the resulting feedback is positive, consequently creating a small hysteresis to ensure oscillation-free transition between the amplifier's active and inactive state.

BRIEF DESCRIPTION OF THE DRAWINGS

Like numerals will be used for identical elements shown in the various figures and their circuits to facilitate understanding.

DETAILED DESCRIPTION OF THE PREFERRED EMBODIMENT

Figure 1:
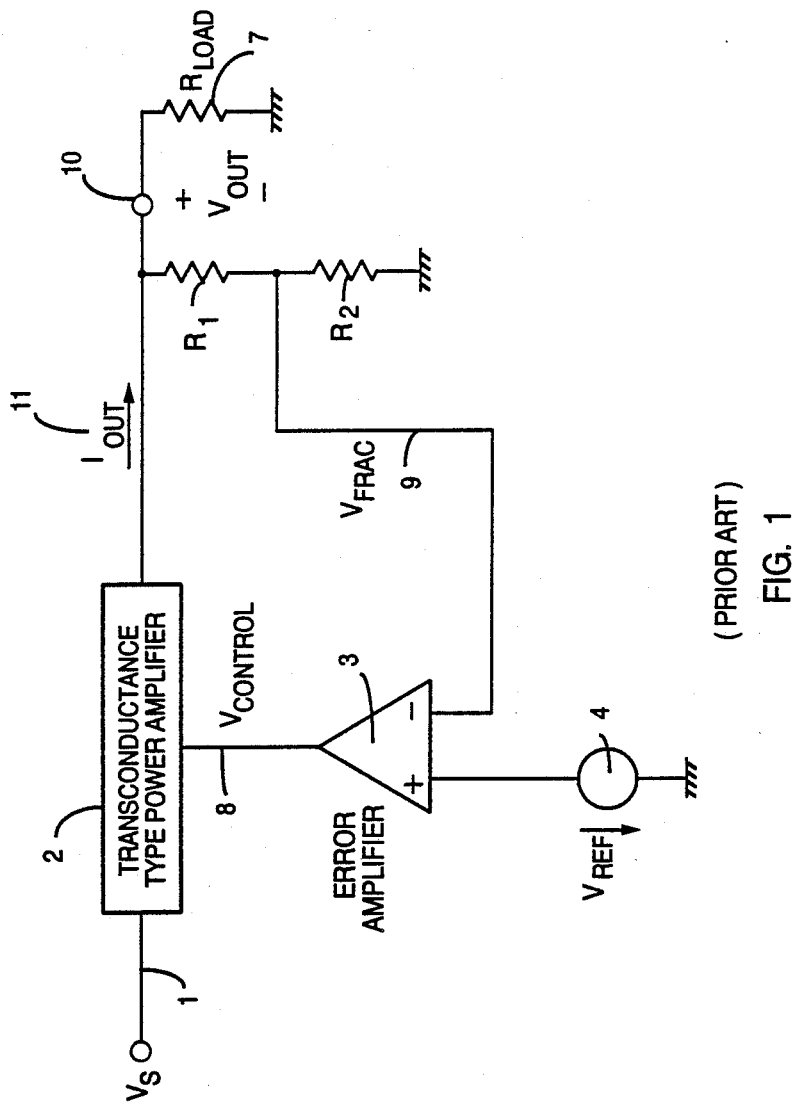
FIG. 1 shows a voltage regulator cell using a transconductance type power amplifier.
Figure 2:
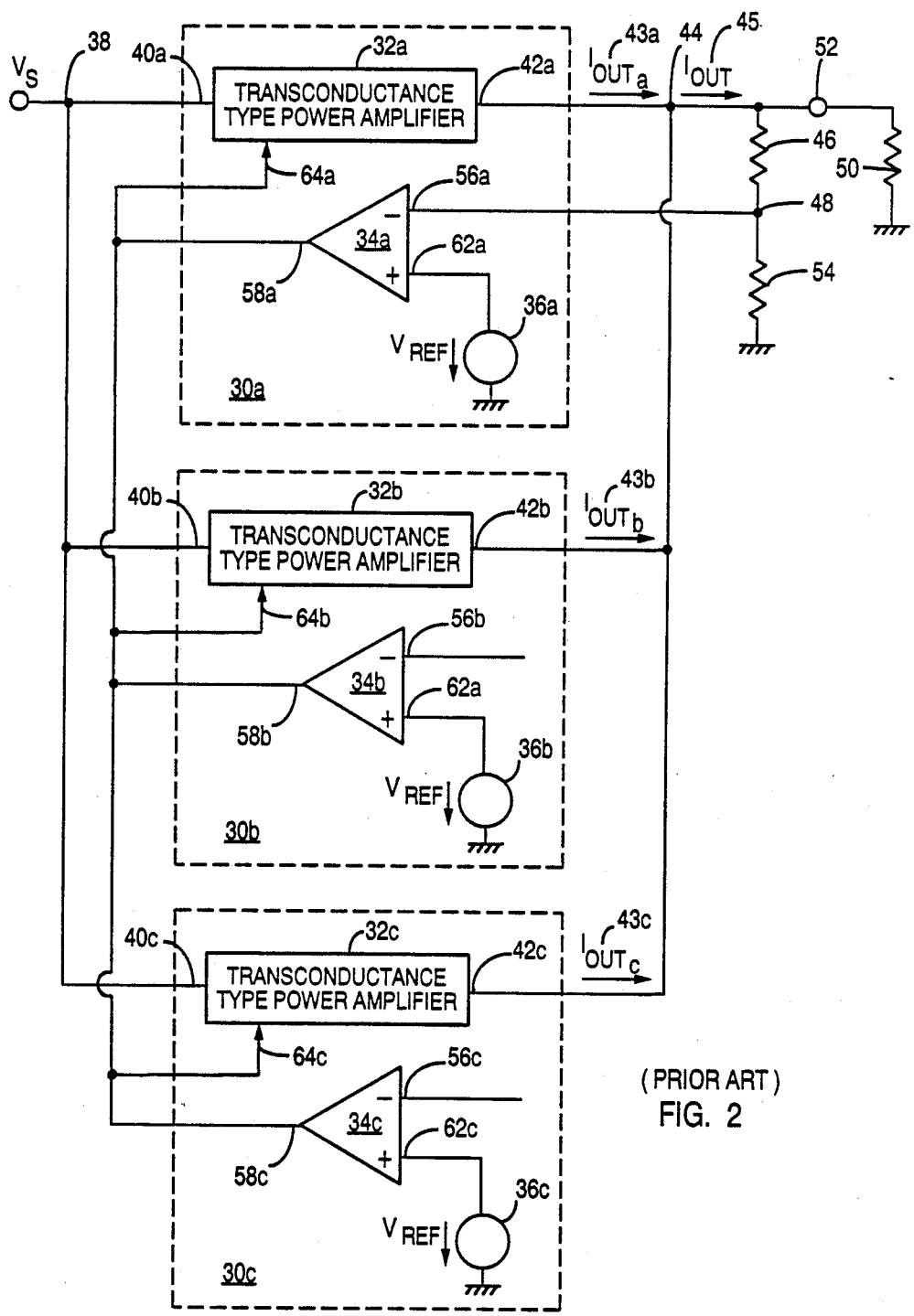
FIG. 2 shows a block diagram of the prior art.
Figure 3:
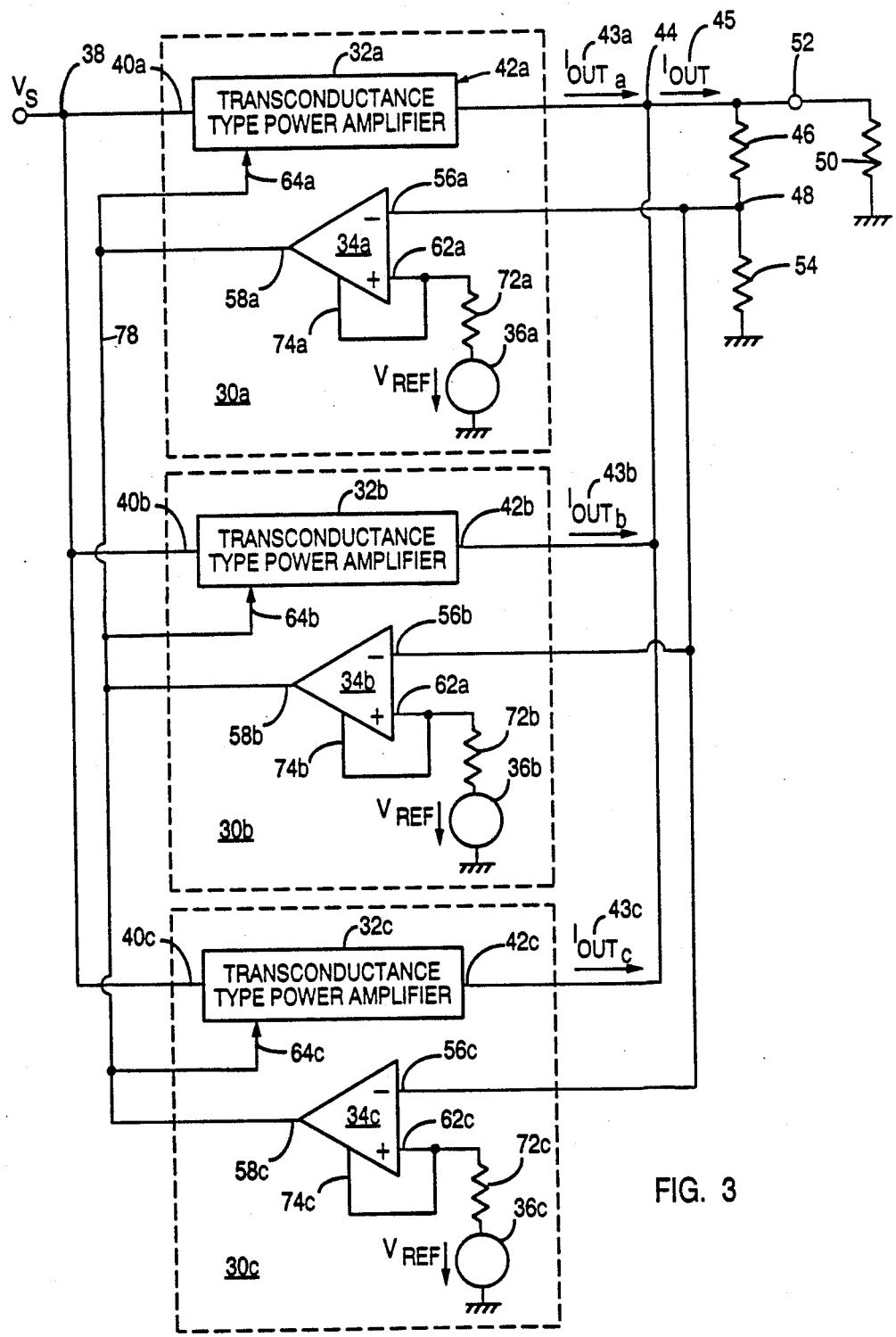
FIG. 3 shows a block diagram of the present invention.

The block diagram of the preferred embodiment shown in FIG. 3 is similar to the block diagram of the prior art showed in FIG. 2, except for the following items. The node 48 which is coupled between voltage divider resistors 46 and 54 and error amplifier input 56a is also coupled to error amplifier inputs 56b and 56c. The error amplifier 58 outputs are internally connected to the control inputs 64 of the transconductance amplifiers 32. Each error amplifier output 58a, 58g and 58c is coupled to one another and to form a common control node 78. A resistor 72 is included in series with the reference voltage circuit along with an error amplifier current control node 74.

Each of the error amplifiers 34a, 34b and 34c of the present invention are designed so that only one error amplifier will operate at any given time. Only the error amplifier which has the highest voltage on its reference input 62 will be active. All the other error amplifiers will be inactive, and thus sinking their maximum sink current. The asymmetrical output current capability of the error amplifiers enables the only active error amplifier one to source a current larger than the sum of all the inactive amplifiers and thereby to control the voltage on node 78 and through this voltage the output current and voltage of the whole system.

Each error amplifier has an internal sense circuitry to sense when it is inactive. The current control node 74 sinks a small amount of current in the amplifier's inactive state. The current on node 74 causes a small voltage drop on resistor 72 which lowers the potential of the reference input 62 of the inactive error amplifiers ensuring that an inactive amplifier does not turn on and off due to secondary effects, including loading effects on the output of the active error amplifier due to its finite output impedance, noise and drift.

Figure 4:
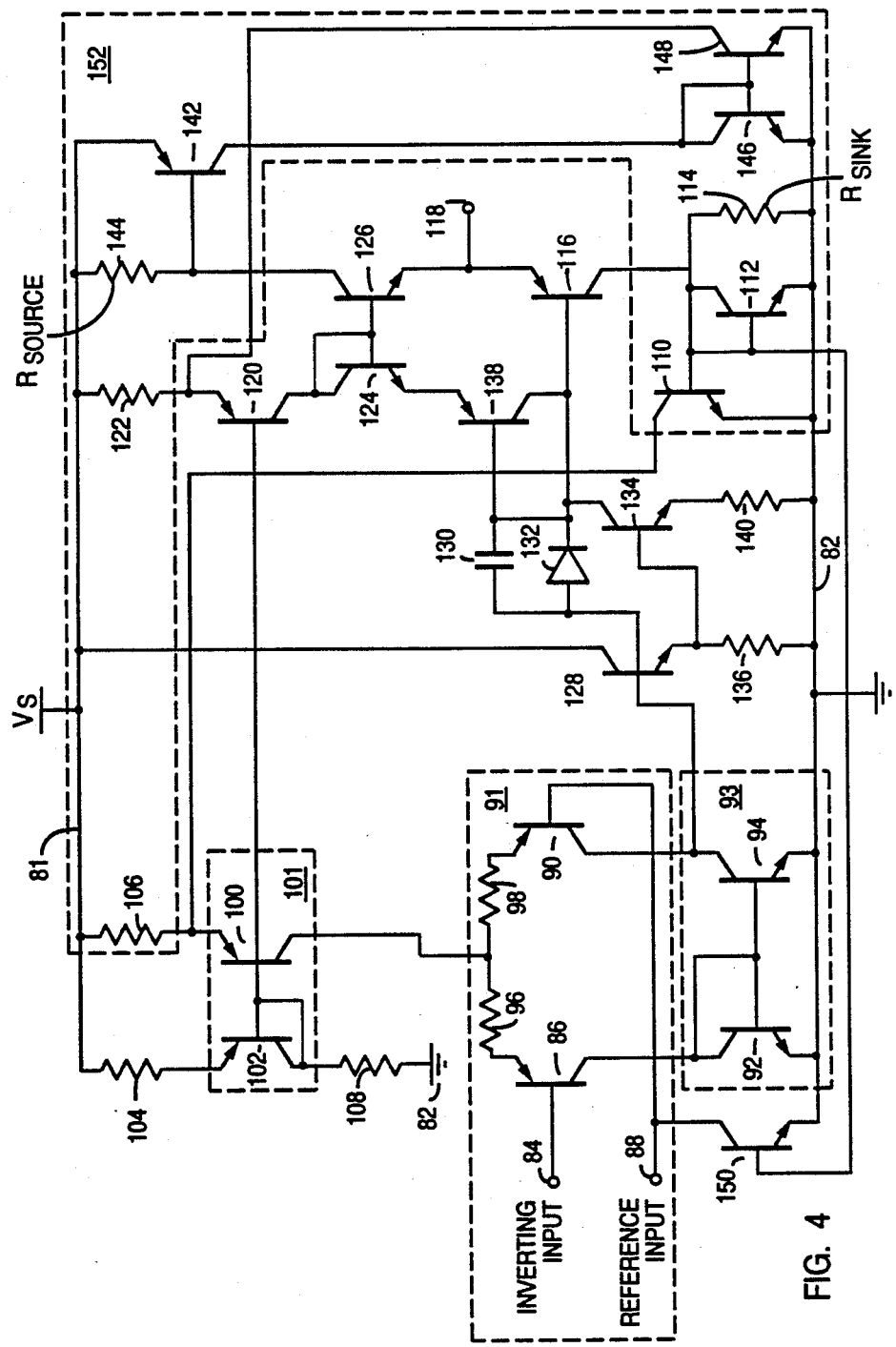
FIG. 4 and FIG. 5 each show a first and second circuit implementation of the error amplifier of the present invention.

The circuit shown in FIG. 4 is one circuit implementation of such an error amplifier. The error amplifier of FIG. 4 is a conventional design except for the current limit circuitry and transistor 150. This circuit has a voltage supply node 81 and a ground node 82. The input stage of the circuit consist of a differential amplifier 91. The differential amp 91 has inverting input 84 coupled to the base of PNP transistor 86 and non-inverting reference input 88 coupled to the base of PNP transistor 90. The collectors of transistors 86 and 90 are coupled into the collectors of a two transistor NPN current mirror 93. The collector of PNP transistor 86 is coupled to the collector of NPN transistor 92. The collector of PNP 90 is coupled to the collector of NPN transistor 94. The bases of transistors 92 and 94 are coupled together and also to the collector of transistor 92. The emitters of transistors 92 and 94 are coupled to ground 82.

The emitter of transistor 86 is coupled to a resistor 96. The emitter of transistor 90 is coupled to another resistor 98. The resistors 96 and 98 are each coupled to the collector of a transistor 100. The transistors 100 and 102 are a current mirror PNP pair 101 used to bias the differential amplifier 91. The bases of transistors 100 and 102 are coupled together. The emitter of transistor 102 is coupled to the supply voltage 81 through resistor 104.

The emitter of transistor 100 is coupled to the supply voltage 81 through resistor 106. The collector of transistor 102 is coupled to the bases of transistor 102 and 100 and also to a resistor 108. The resistor 108 is also coupled to ground 82. As will be described below, the emitter of transistor 100 plays a role in the sinkside current limit. The emitter of transistor 100 is coupled to the collector of NPN transistor 110. The emitter of transistor 110 is coupled to ground 82. The base of transistor 110 is coupled to the base and collector of NPN transistor 112.

The emitter of transistor 112 is coupled to ground 82. The collector of transistor 112 is also coupled to sink current sense resistor 114 and to the collector of PNP transistor 116. The sink current sense resistor $R_{sink}$ 114 is also coupled to ground. The emitter of transistor 116 is coupled to the output 118 of the error amplifier. The base of transistor 102 also drives the base of PNP transistor 120. The emitter of transistor 120 is coupled to resister 122. Resistor 122 is also coupled to the voltage supply 81. The collector of transistor 120 is coupled to the collector and base of NPN transistor 124 and the base of output high drive transistor 126.

The collector of transistor 94 is coupled to the base of transistor 128, capacitor 130 and positive electrode of diode 132. The collector of transistor 128 is coupled to the voltage supply 81. The emitter of transistor 128 is coupled to the base of transistor 134 and to the resistor 136. The resistor 136 is also coupled to ground 82. The collector of transistor 134 is coupled to the negative terminal of diode 132, the base of transistor 138, to the second terminal of capacitor 130. The emitter of transistor 134 is coupled to resistor 140. The other terminal of resistor 140 is coupled to ground 82.

The collector of PNP transistor 138 is coupled to the base of transistor 138 and to the collector of transistor 134 and the base of transistor 116. The emitter of transistor 138, coupled to the emitter of NPN transistor 124. The collector of transistor 126 is coupled to the base of PNP transistor 142 and to the source current sense resistor 144. Source current sense resistor 144 is also coupled to the voltage supply 81. The emitter of PNP transistor 142 is coupled to the voltage supply 81. The collector of transistor 142 is coupled to the collector and base of transistor 146 and to the base of transistor 148. The emitters of transistors 146 and 148 are coupled to ground 82. The collector of transistor 148 is coupled to the emitter of transistor 120.

The base of NPN transistor is connected to the bases of transistors 110 and 112, its emitter is connected to the ground 82, and its collector to the amplifier's noninverting input 88.

The sink-side current limit works as follows. The sink direction load current flows through sense resistor $R_{sink}$ 114. As long as the voltage drop on this resistor is lower than $V_{BE}$ (~700 mV at room temp) the transistors 110 and 150 are off, so that their collector current is approximately zero. As the current sunk by the amplifier increases, the voltage drop across transistor 110 exceeds $V_{be}$ and turns on and pulls down the emitter of transistor 100. This decreases the bias current of the differential amplifier 101 transistors 86 and 90, the available base current of the main amplifier transistors 128 and 134 and ultimately the available base-current of output transistor 116 in effect limiting the available output sink current. The sink current-limit loop-gain can be influenced by the emitter are ratio of transistors 110 and 112. If the sink current limit is active, the transistor 110 conducts current and so does the transistor 150 because its base-emitter diode is connected in parallel with the one of transistor 110. The current sunk by the collector of 150 in this case flows into node 88 and causes a voltage drop on any resistor connected externally to this node as was said in connection with FIG. 3.

The trigger level for the source side current limit must be higher than the sum of the maximum sink currents of the maximum number of parallel operated systems. The circuit operates similarly as the low side limit. If the voltage drop on the resistor 144 source current sense resistor exceeds 1 $V_{BE}$ voltage drop, the transistor 142 turns on, its current is turned around by transistors 146-148 of the current mirror and pulls down the emitter of transistor 120 thereby limiting the collector current of the transistor 120 and the available base current of the transistor 126 output transistor.

Figure 5:
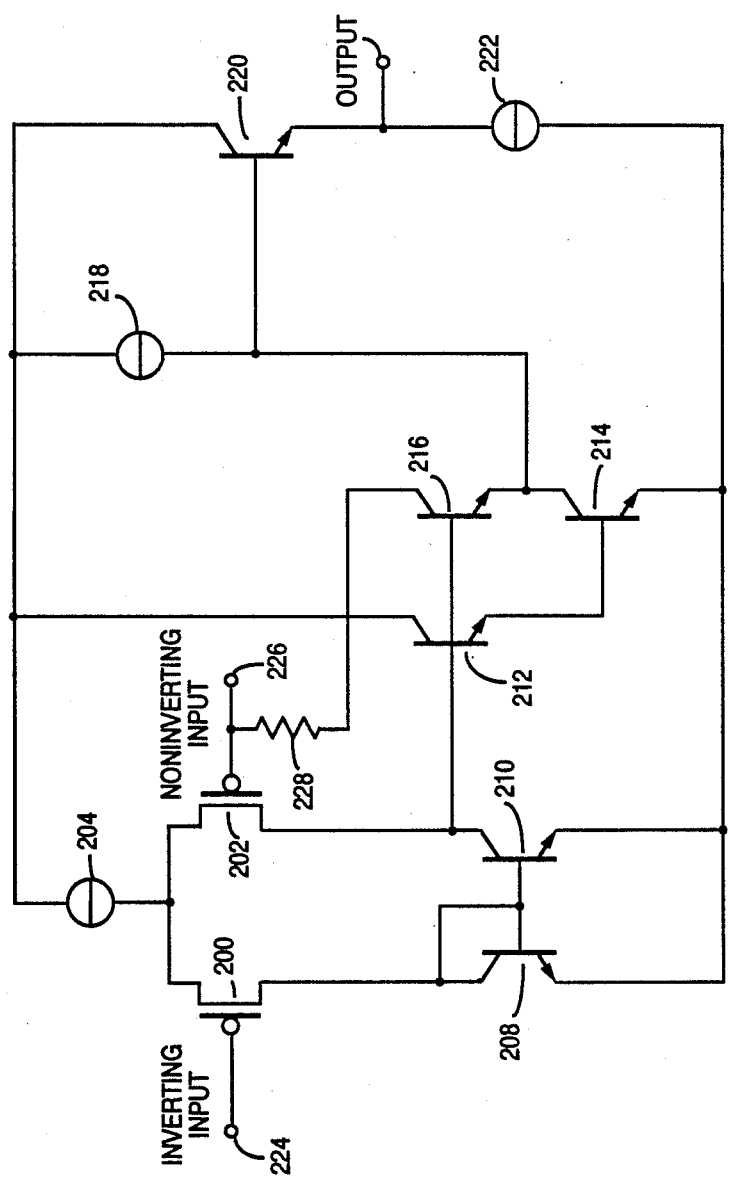

FIG. 5 shows another possible implementation of the error amplifier. The asymmetrical output current capability is an inherent characteristic of the emitter-follower output stage, the maximum sink current being limited by the pull-down current 222 while the maximum source current is limited by the pullup current 218 multiplied by the gain factor $\beta$ of the output transistor 220.

If the output stage sinks its maximum current the main amplifier transistor 214 is nearly in saturation and 216 turns on sinking some current from node 226 (the noninverting input of the amplifier) thereby creating positive feedback. The amount of current is limited by resistor 228.

The present invention is described with respect to a preferred embodiment. Various modifications which become apparent to one skilled in the art after studying this document are deemed to be within the spirit and scope of the present invention.

What is claimed is:

1. An error amplifier system for use with a transconductance type power amplifier comprising:
   a. a plurality of error amplifiers, each of said error amplifiers having an output means;
   b. means for electrically coupling each of said output means to every other said output means;
   c. means for establishing an asymmetrical current capacity for each of said output means, said asymmetrical current capacity having a current sourcing capability greater than a current sinking capability.

2. The error amplifier system according to claim 1 wherein each one of said plurality of error amplifier further comprises:
   a. a reference voltage supply;
   b. a first amplifier input coupled to said reference voltage supply;
   c. a second amplifier input coupled to the second amplifier input of every other said amplifier in the system;
   d. an asymmetrically limited output current having a maximum sinking output current level;
   e. a sense circuit for sensing operation of the amplifier at the maximum sinking output current level and forming a signal; and
   f. positive feedback means for changing the reference voltage supply in response to said signal.

3. The error amplifier system according to claim 2 wherein said current sourcing capability is greater than a sum of all of said current sinking capabilities.

4. The error amplifier system according to claim 3 wherein said error amplifier comprises an operational amplifier.

5. The error amplifier system according to claim 4 wherein transconductance type power amplifier comprises a plurality of supply stages electrically coupled to one another.

6. The error amplifier system according to claim 5 wherein each of said supply stages includes an error amplifier.

7. The error amplifier system according to claim 6 wherein the transconductance type power amplifier is a dc to dc converter.

8. The error amplifier system according to claim 6 wherein the transconductance type power amplifier is a linear voltage regulator.

9. An error amplifier system for use with a dc voltage to dc voltage converter comprising:
   a. a plurality of dc converter stages electrically coupled for increased current capability;
   b. a plurality of error amplifiers, each of said error amplifiers comprising an operational amplifier;
   c. each of said stages having one of said error amplifiers;
   d. each of said error amplifiers having:
      (1) a current sourcing means;
      (2) a current sinking means;
      (3) an output means coupled to said current sourcing means and to said current sinking means;
   e. means for electrically coupling each of said output means to every other said output means;
   f. means for establishing and asymmetrical current limit each of said error amplifiers, having a first current carrying capability for said source current means greater than a second current carrying capability for said sink current means,
   whereby said first current carrying capability for each of said error amplifiers is greater than a combined value of all of said second current carrying capabilities.

10. An error amplifier comprising:
    a. plurality of differential amplifiers, each said amplifier having:
       (1) a first input, wherein each said first input of each said amplifier is coupled to every other said first input;
       (2) a second input, wherein each said second input of each said amplifier is coupled to every other said second input;
       (3) an output, each said output of each said amplifier is coupled to every other said output;
       (4) an output source current capability;
       (5) an output sink current capability; and
       (6) an asymmetrical current output current capability; and
    b. a reference voltage coupled to said second inputs whereby each said source current capability can source a sum of all said sink current capabilities.

11. The error amplifier according to claim 10 wherein each said amplifier further comprises:
    a. a maximum sink current output level;
    b. a sense circuit for sensing whether the amplifier is operating at its maximum sink current output level;
    c. response means for generating a signal if the sense circuit senses that the amplifier is operating at its maximum sink current output level; and
    d. means for changing said reference voltage in response to said signal resulting in positive feedback.

* * * * *

UNITED STATES PATENT AND TRADEMARK OFFICE
CERTIFICATE OF CORRECTION

PATENT NO. : 4,920,309

DATED : April 24, 1990

INVENTOR(S) : Tamas S. Szepesi

It is certified that error appears in the above - identified patent and that said Letters Patent is hereby corrected as shown below:

<u>On the title page</u>
<u>in the Abstract</u>:

Line 10, replace "including" with --comprising of--.

In Col. 2. line 13, replace "is" with --in--.

In Col. 3, line 18, replace "58g" with --58b--.

In Col. 5, line 1, replace "are" with --area--.

In Col. 6, line 8, after wherein, insert --said--.

In Col. 6, line 34, after limit, insert --for--.

Signed and Sealed this

Sixth Day of August, 1991

Attest:

HARRY F. MANBECK, JR.

*Attesting Officer*  *Commissioner of Patents and Trademarks*